(12) United States Patent
Ping et al.

(10) Patent No.: US 9,804,920 B2
(45) Date of Patent: Oct. 31, 2017

(54) RANK AND PAGE REMAPPING LOGIC IN A VOLATILE MEMORY

(71) Applicant: Samsung Electronics Co., Ltd., Suwon-si, Gyeonggi-do (KR)

(72) Inventors: Zhan Ping, Milpitas, CA (US); Matteo Monchiero, San Francisco, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 149 days.

(21) Appl. No.: 14/720,934

(22) Filed: May 25, 2015

(65) Prior Publication Data

US 2016/0147623 A1     May 26, 2016

Related U.S. Application Data

(60) Provisional application No. 62/082,600, filed on Nov. 20, 2014.

(51) Int. Cl.
| | |
|---|---|
| *G06F 11/00* | (2006.01) |
| *G06F 11/10* | (2006.01) |
| *G06F 12/1009* | (2016.01) |
| *G06F 11/16* | (2006.01) |

(Continued)

(52) U.S. Cl.
CPC ...... *G06F 11/1048* (2013.01); *G06F 11/1016* (2013.01); *G06F 11/1666* (2013.01); *G06F 12/1009* (2013.01); *G06F 11/20* (2013.01); *G06F 2201/82* (2013.01); *G06F 2201/85* (2013.01); *G06F 2212/65* (2013.01); *G06F 2212/70* (2013.01); *G11C 11/408* (2013.01)

(58) Field of Classification Search
CPC ............ G06F 11/1048; G06F 11/1015; G06F 11/1666; G06F 11/20; G06F 12/1009; G06F 2201/82; G06F 2201/85; G06F 2212/65; G06F 2212/70; G06F 2212/1032; G11C 11/408
See application file for complete search history.

(56) References Cited

U.S. PATENT DOCUMENTS 6,446,184 B2 *  9/2002  Dell ..................... G06F 12/0646
                                                   711/101
6,947,341 B2 *  9/2005  Stubbs ................ G06F 12/0684
                                                    365/201

(Continued)

*Primary Examiner* — Marc Duncan
(74) *Attorney, Agent, or Firm* — Renaissance IP Law Group LLP

(57) ABSTRACT

Embodiments of the inventive concept include a plurality of memory ranks, a buffer chip including a rank remap control section configured to remap a rank from among the plurality of memory ranks of the volatile memory module responsive to a failure of the rank, and a dynamic serial presence detect section configured to dynamically update a stated total capacity of the volatile memory module based at least on the remapped rank. In some embodiments, a memory module includes a plurality of memory ranks, an extra rank in addition to the plurality of memory ranks, the extra rank being a spare rank configured to store a new page corresponding to a failed page from among the plurality of ranks, and a buffer chip including a page remap control section configured to remap the failed page from among the plurality of ranks to the new page in the extra rank.

18 Claims, 11 Drawing Sheets

(51) Int. Cl.
    *G11C 11/408*    (2006.01)
    *G06F 11/20*    (2006.01)

(56) References Cited

U.S. PATENT DOCUMENTS

| | | | |
|---|---|---|---|
| 7,984,329 B2 * | 7/2011 | Lastras-Montano | G11C 29/76 714/6.2 |
| 8,458,514 B2 | 6/2013 | Harris et al. | |
| 8,495,435 B2 | 7/2013 | Morris et al. | |
| 9,372,750 B2 * | 6/2016 | Chun | G06F 11/1008 |
| 2001/0000822 A1 * | 5/2001 | Dell | G06F 13/1694 711/170 |
| 2002/0133742 A1 | 9/2002 | Hsu et al. | |
| 2008/0270675 A1 * | 10/2008 | Nagaraj | G06F 12/0246 711/100 |
| 2011/0125982 A1 * | 5/2011 | Choi | G06F 11/073 711/200 |
| 2012/0072768 A1 * | 3/2012 | Morris | G06F 11/1666 714/6.2 |
| 2013/0060996 A1 * | 3/2013 | Berke | G06F 3/0683 711/105 |
| 2013/0176768 A1 * | 7/2013 | Wang | G11C 29/808 365/149 |
| 2013/0254506 A1 * | 9/2013 | Berke | G06F 11/1658 711/165 |

\* cited by examiner

| INITIAL RANK BITS MAPPING 360 | NEW RANK BITS MAPPING 365 |
|---|---|
| 000 | 000 |
| 001 | 001 |
| 010 | 011 |
| 011 | 100 |
| 100 | 101 |
| 101 | 111 |
| 110 | |
| 111 | |

FIG. 5B

RANK AND PAGE REMAPPING LOGIC IN A VOLATILE MEMORY

RELATED APPLICATION DATA

This application claims the benefit of U.S. Patent Application Ser. No. 62/082,600, filed Nov. 20, 2014, which is hereby incorporated by reference.

BACKGROUND

The present inventive concepts relate to memory modules, and more particularly, to memory rank remap logic and memory page remap logic in a volatile memory.

A volatile memory module such as a dynamic random access memory (DRAM) module is a key component of modern day computer servers and other computing systems. DRAM modules are known to fail after running for a certain amount of time. Upon failure, the computer server gives an error message in an error log indicating that the failed module has failed. Such a failure typically requires that the DRAM module be replaced with a new module. This requires that the computer server be taken out of service, powered down, and the faulty DRAM module removed and replaced. Not only does this cause down-time for the computer server, which results in interruption to computing processes, but the total cost of ownership also increases due to the cost of the replacement parts. Such events can cause significant disruption to businesses and individuals who rely on computing power for a wide array of tasks.

Moreover, most failed DRAM modules have only a single failure of a memory rank (sometimes referred to as a memory bank), yet conventionally, the whole DRAM module must be replaced. The failure of the memory rank can result in gaps in the address space corresponding to the portion of the address space mapped to a faulty rank, thereby rendering the entire DRAM module inoperable. Embodiments of the present inventive concept address these and other limitations in the prior art.

BRIEF SUMMARY

Embodiments of the inventive concept include a plurality of memory ranks, a buffer chip including a rank remap control section configured to remap a rank from among the plurality of memory ranks of the volatile memory module responsive to a failure of the rank, and a dynamic serial presence detect section configured to dynamically update a stated total capacity of the volatile memory module based at least on the remapped rank.

Embodiments of the inventive concept can include a plurality of memory ranks, an extra rank in addition to the plurality of memory ranks, the extra rank being a spare rank configured to store a new page corresponding to a failed page from among the plurality of ranks, and a buffer chip including a page remap control section configured to remap the failed page from among the plurality of ranks to the new page in the extra rank.

In some embodiments, a memory system includes a plurality of volatile memory buffers including a plurality of ranks, each rank including a plurality of memory pages, and a memory controller including a dynamic serial presence detect section, a rank remap control section, and a page remap control section.

BRIEF DESCRIPTION OF THE DRAWINGS

The foregoing and additional features and advantages of the present inventive principles will become more readily apparent from the following detailed description, made with reference to the accompanying figures, in which:

FIG. 5B is yet another example rank remap table in accordance with embodiments of the inventive concept.

DETAILED DESCRIPTION

Figure 1:
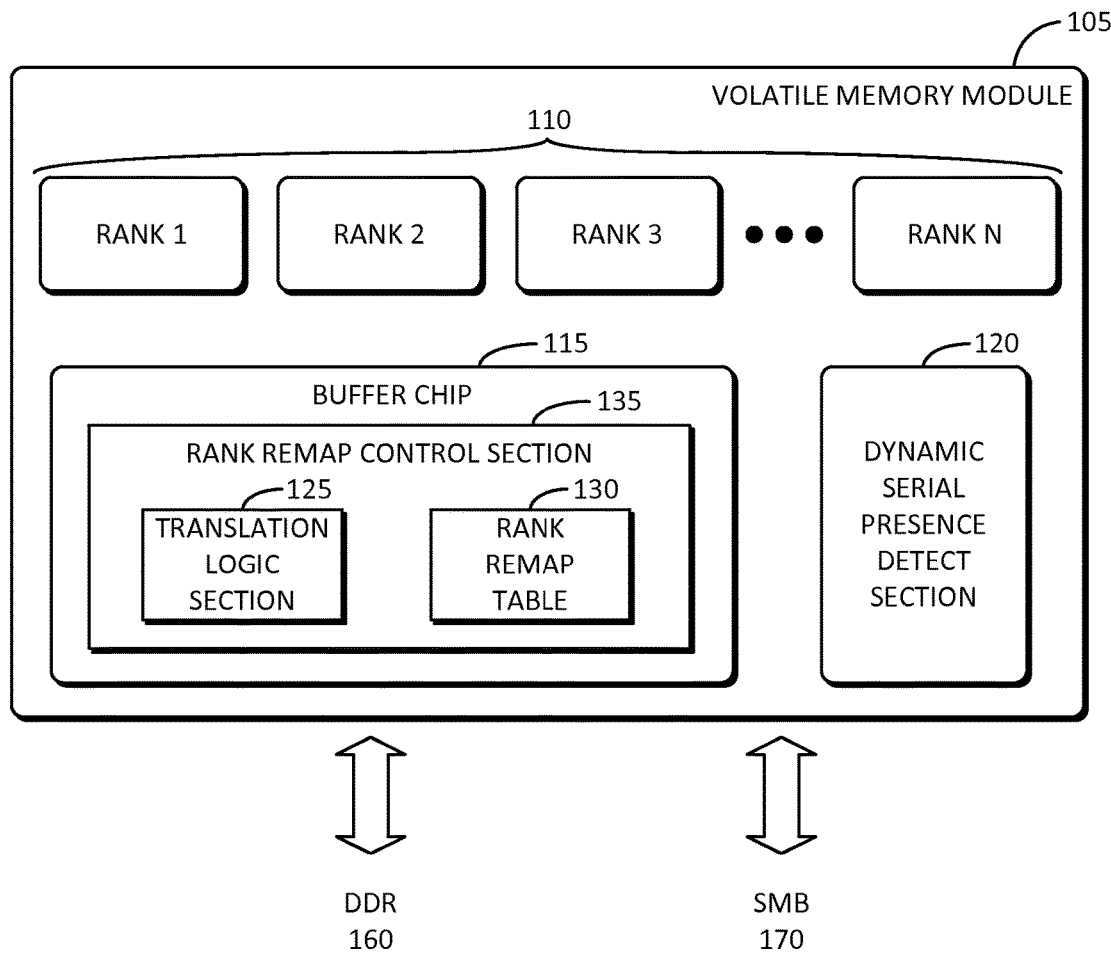
FIG. 1 is an example block diagram of a volatile memory module in accordance with embodiments of the inventive concept.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first memory rank could be termed a second memory rank, and, similarly, a second memory rank could be termed a first memory rank, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the inventive concept include devices and techniques for salvaging volatile memory modules such as dual in-line memory modules (DIMMs) and/or DRAM modules that have one or more faulty ranks, so that the memory module can continue to operate while maintaining a linear address space. Based on further embodiments of the inventive concept disclosed herein, memory pages can be remapped that have been determined to be faulty. An extra rank is reserved as spare storage in addition to the normal capacity of the memory module. Memory pages that are determined to be faulty can be remapped to the extra rank. These techniques serve to reduce maintenance costs of server systems and datacenters by reducing the incident of outright memory module failures. Even when there are failed ranks and/or pages, the memory modules disclosed herein can continue to operate reliably with little to no degradation in performance or capacity.

FIG. 1 is an example block diagram of a volatile memory module 105 in accordance with embodiments of the inventive concept. The volatile memory module 105 can be a DRAM module, for example, or any other suitable volatile memory module. The volatile memory module 105 can include multiple memory ranks 110. The ranks 110 can be numbered, for example, from 1 to N. The volatile memory module 105 can include a buffer chip 115 such as a load reduced DIMM. The buffer chip 115 can include a rank remap control section 135. The rank remap control section 135 can include a translation logic section 125 and/or a rank remap table 130. The volatile memory module 105 can include a dynamic serial presence detect section 120. The dynamic serial presence detect section 120 can be re-writable and can be changed responsive to a rank failure, as further described below. The volatile memory module 105 can communicate with other components of a computer server or system via a double data rate (DDR) 160 protocol, a serialized memory bus (SMB) 170 protocol, or the like.

The rank remap control section 135 can remap a particular rank from among the ranks 110 responsive to a failure of the particular rank. The dynamic serial presence detect section 120 can update a stated total capacity of the volatile memory 105 based at least on the remapped rank. Alternatively or in addition, the dynamic serial presence detect section 120 can provide updated baseline information about the volatile memory module 105, such as address space changes, or capacity changes, for example, whenever a change occurs to the rank remap table 130.

Alternatively or in addition, the dynamic serial presence detect section 120 can dynamically reduce the stated total capacity of the volatile memory module 105 by approximately a capacity of the failed rank responsive to the failure of the rank. Such a reduction in capacity can be relatively minor compared to the total available capacity, and therefore, can be imperceptible to the user. Alternatively or in addition, the dynamic serial presence detect section 120 can dynamically change one or more settings of the volatile memory module 105 responsive to the failure of the rank. Operative and structural features of the buffer chip 115, the rank remap control section 135, the translation logic section 125, and the rank remap table 130 are discussed in additional detail below.

Figure 2:
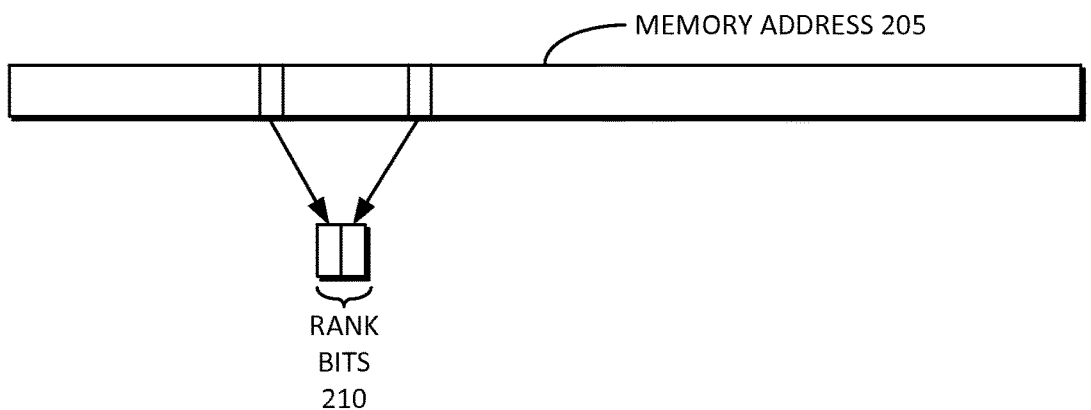
FIG. 2 is an example block diagram of a memory address in accordance with embodiments of the inventive concept.

FIG. 2 is an example block diagram of a memory address 205 in accordance with embodiments of the inventive concept. The memory address 205 can include rank bits 210, which can designate which of the ranks 110 (of FIG. 1) includes the memory address 205. The rank bits 210 can be used, for example, by the rank remap control section 135, the translation logic section 125, and/or the rank remap table 130 as further described below.

Figure 3A:
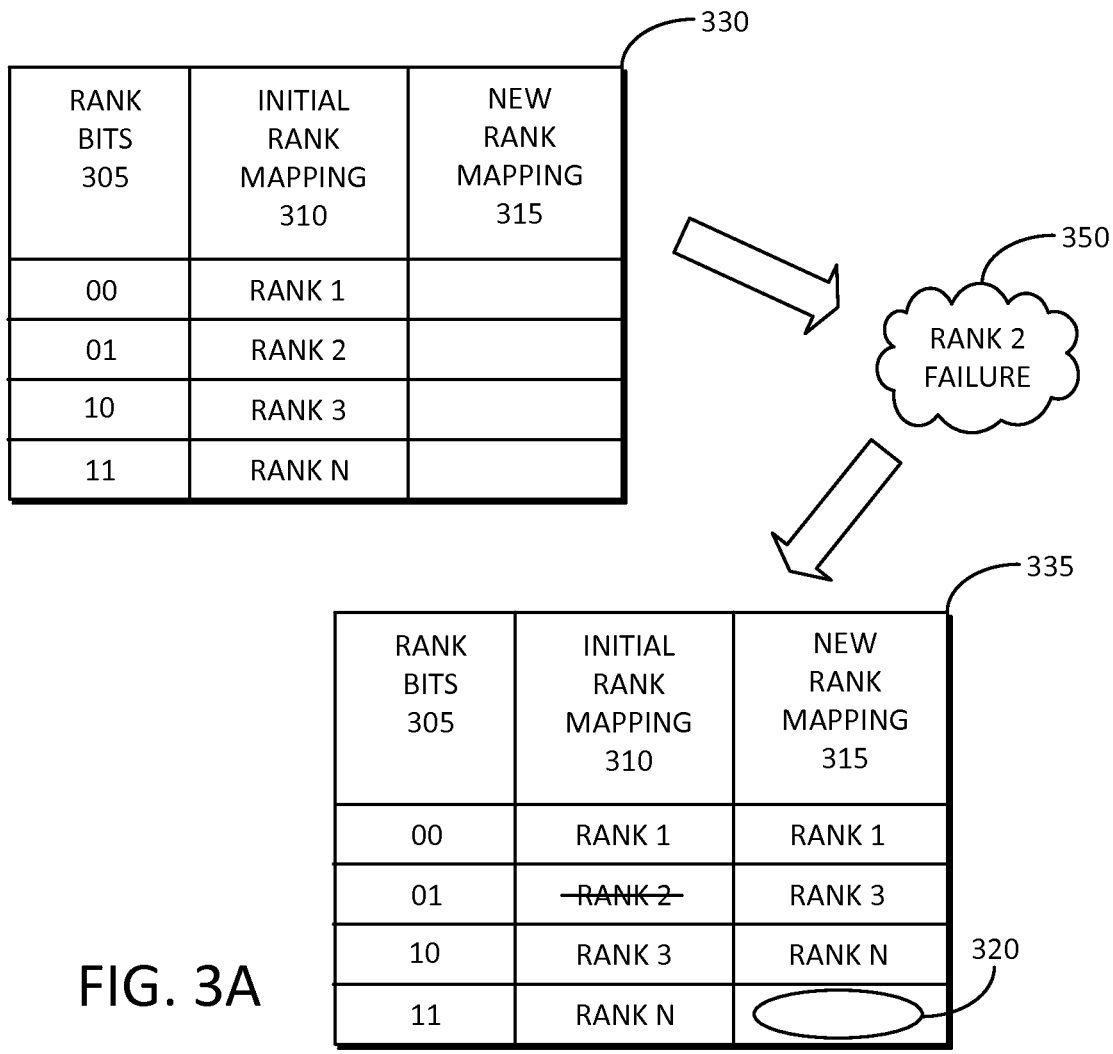
FIG. 3A is an example block and flow diagram of a rank failure and re-map in accordance with embodiments of the inventive concept.
Figure 3B:
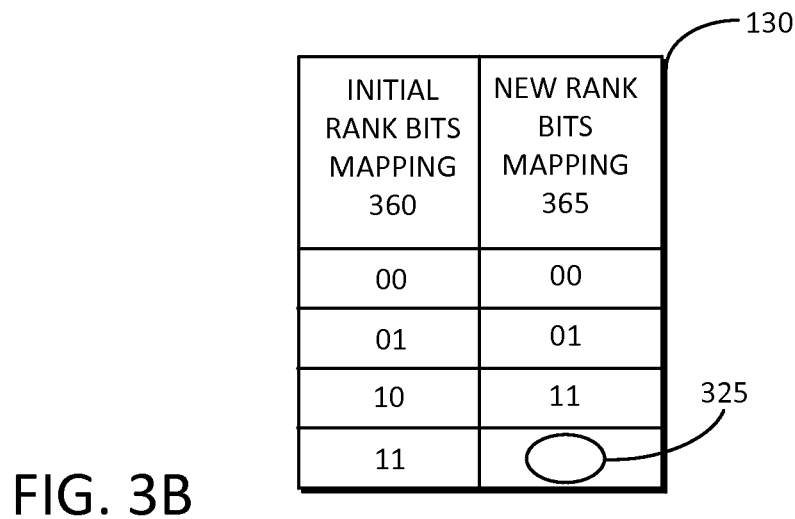
FIG. 3B is an example rank remap table in accordance with embodiments of the inventive concept.

FIG. 3A is an example block and flow diagram of a rank failure and re-map in accordance with embodiments of the inventive concept. FIG. 3B is an example rank remap table in accordance with embodiments of the inventive concept. Reference is now made to FIGS. 3A and 3B.

Block 330 shows rank bits 305, initial rank mapping 310, and new rank mapping 315. Block 330 can be representative of an initial state that is prior to the failure of any of the ranks 1 through N, listed in the initial rank mapping 310. The rank bits 305 can identify the ranks of the initial rank mapping 310. For example, rank bits 00 can correspond to rank 1, rank bits 01 can correspond to rank 2, rank bits 10 can correspond to rank 3, rank bits 11 can correspond to rank N, and so forth. In the initial state, the new rank mappings 315 can be blank or otherwise unused.

In the event of a rank failure, for example, a failure of rank 2 as shown at 350, a rank failure state is shown in block 335. In this example, rank 2 has failed, which can be reflected in the new rank mapping 315. For example, rank bits 00 can correspond to rank 1, rank bits 01 can correspond to rank 3 rather than rank 2, rank bits 10 can correspond to rank N rather than rank 3, and rank bits 11 can correspond to a null entry 320 in the new rank mapping 315. In effect, ranks 3 and N are shifted up in the new rank mapping 315 relative to the initial rank mapping 310. This technique can maintain linearity within the new rank mapping 315 relative to the rank bits 305. In other words, the physical locations of the ranks 1, 2, 3, and N remain the same, but rank bits 01 and 10 will become logically associated with ranks 3 and N, respectively, rather than ranks 2 and 3.

It will be understood that instead of the initial rank mapping 310 and new rank mapping 315 being separate, a single rank mapping can combine the initial rank mapping 310 and the new rank mapping. In other words, the initial entries and the new entries can coexist within a same rank mapping.

As shown in FIG. 3B, the rank remap table 130 can include an initial rank bits mapping 360 and a new rank bits mapping 365. The initial rank bits mapping 360 can include entries (e.g., 00, 01, 10, and 11) representing an initial mapping of the memory ranks 110 (of FIG. 1). The new rank bits mapping 365 can include entries (e.g., 00, 01, and 11) representing a new mapping of the memory ranks 110. The translation logic section 125 (of FIG. 1) can map between the initial rank bits mapping 360 and the new rank bits mapping 365 based at least on the rank remap table 130.

In response to the failure of a memory rank, for example, associated with the entry 10, the translation logic section 125 (of FIG. 1) can determine that the entry 10 from among the entries 00, 01, 10, and 11 of the initial rank bits mapping 360 is invalid. The translation logic section 125 can cause the remaining entries 00, 01, and 11 of the new rank bits mapping 365 to exclude the entry 10 that is equivalent or otherwise representative of the failed rank. In other words, the new rank bits mapping 365 does not include the entry 10 that is associated with the failed rank. Rather, the new rank bits mapping 365 can include a null entry 325 at the end of the list of entries 00, 01, and 11. The entries 00, 01, and 11 can remain adjacent to each other in a linear pattern within the new rank bits mapping 365 relative to the initial rank bits mapping 360.

Put differently, the new rank bits mapping 365 can include a null entry 325 representing the failed memory rank, and non-null entries (e.g., 00, 01, and 11) representing non-failed memory ranks. The null entry 325 can be at an end of the entries of the new rank bits mapping 365. Each non-null entry (e.g., 00, 01, and 11) of the new rank bits mapping 365 can be adjacent to at least one other non-null entry (e.g., 00, 01, and 11). The last remaining non-null entry (e.g., 11) can be adjacent to only one other non-null entry (e.g., 01). The null entry 325 can be adjacent to only one non-null entry (e.g., 11).

The entries of the initial rank bits mapping 360 can range incrementally from lower order bits (e.g., 00) to higher order bits (e.g., 11). Each of the entries of the new rank bits mapping 365 can include a set of bits (e.g., 00, 01, and 11) or a null entry (e.g., 325). The higher order bits (e.g., 11) of the initial rank bits mapping 360 can be associated with the null entry 325. The lower order bits (e.g., 00, 01, and 10) of the initial rank bits mapping 360 can be associated with the set of bits (e.g., 00, 01, and 11), respectively, of the new rank bits mapping 365.

Figure 4A:
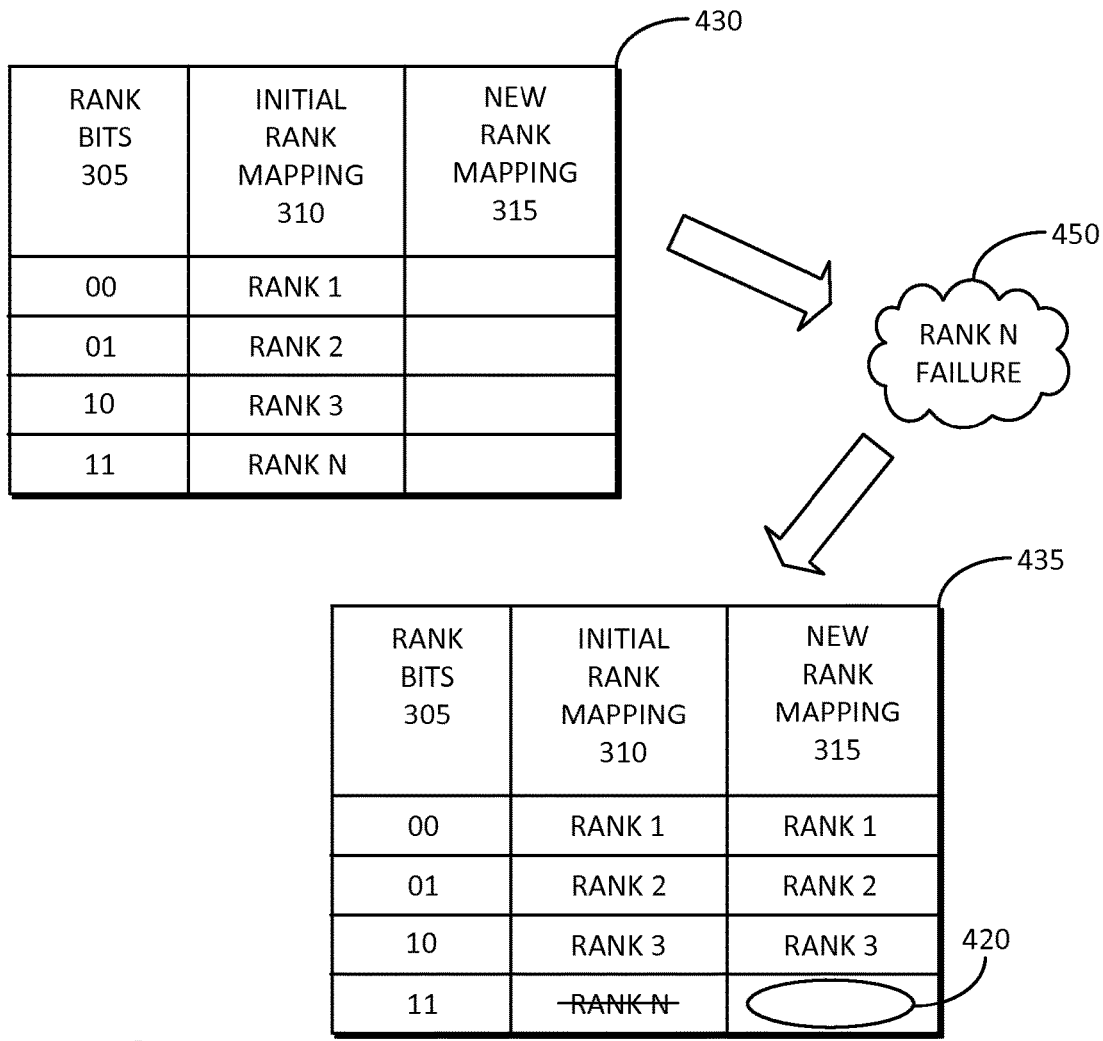
FIG. 4A is another example block and flow diagram of a rank failure and re-map in accordance with embodiments of the inventive concept.
Figure 4B:
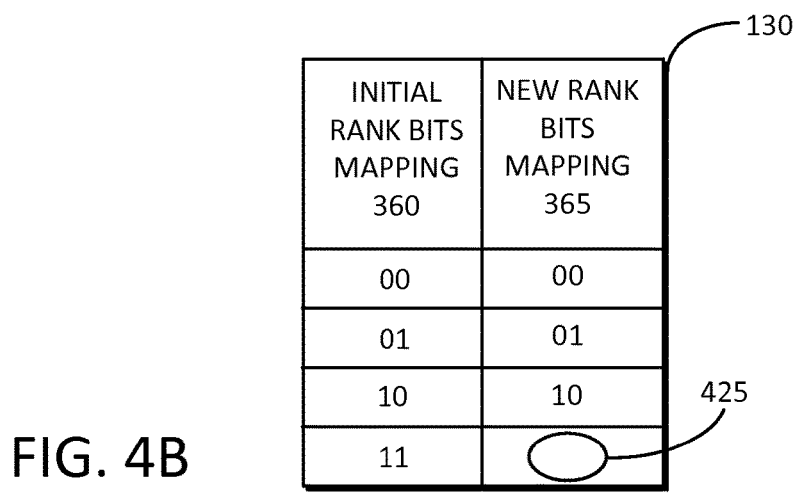
FIG. 4B is another example rank remap table in accordance with embodiments of the inventive concept.

FIG. 4A is another example block and flow diagram of a rank failure and re-map in accordance with embodiments of the inventive concept. FIG. 4B is another example rank remap table in accordance with embodiments of the inventive concept. Reference is now made to FIGS. 4A and 4B. Some of the elements in FIGS. 4A and 4B are similar to or the same as elements of FIGS. 3A and 3B, and therefore, a detailed description of such elements is not repeated.

In this example embodiment, rank N can experience a failure as shown at 450. This can cause a transition from block 430 to block 435, and an associated change of state. The failure of rank N can be reflected in the new rank mapping 315. For example, rank bits 00 can correspond to rank 1, rank bits 01 can correspond to rank 2, rank bits 10 can correspond to rank 3, and rank bits 11 can correspond to a null entry 420 in the new rank mapping 315. In effect, ranks 1 through 3 remain in the same position in the new rank mapping 315 relative to the initial rank mapping 310. This technique can maintain linearity within the new rank mapping 315 relative the initial rank mapping 310. But the rank N is not present in the new rank mapping 315. Rather, a null entry 420 exists where the rank N would otherwise have existed were it not for the failure.

As shown in FIG. 4B, the rank remap table 130 can include an initial rank bits mapping 360 and a new rank bits mapping 365. The initial rank bits mapping 360 can include entries (e.g., 00, 01, 10, and 11) representing an initial mapping of the memory ranks 110 (of FIG. 1). The new rank bits mapping 365 can include entries (e.g., 00, 01, and 10) representing a new mapping of the memory ranks 110. The translation logic section 125 (of FIG. 1) can map between the initial rank bits mapping 360 and the new rank bits mapping 365 based at least on the rank remap table 130.

Put differently, the new rank bits mapping 365 can include a null entry 425 representing the failed memory rank, and non-null entries (e.g., 00, 01, and 10) representing non-failed memory ranks. The null entry 425 can be at an end of the entries of the new rank bits mapping 365. Each non-null entry (e.g., 00, 01, and 10) of the new rank bits mapping 365 can be adjacent to at least one other non-null entry (e.g., 00, 01, and 10). The last remaining non-null entry (e.g., 10) can be adjacent to only one other non-null entry (e.g., 01). The null entry 425 can be adjacent to only one non-null entry (e.g., 10).

Each of the entries of the new rank bits mapping 365 can include a set of bits (e.g., 00, 01, and 10) or a null entry (e.g., 425). The higher order bits (e.g., 11) of the initial rank bits mapping 360 can be associated with the null entry 425. The lower order bits (e.g., 00, 01, and 10) of the initial rank bits mapping 360 can be associated with the set of bits (e.g., 00, 01, and 10), respectively, of the new rank bits mapping 365.

Figure 5A:
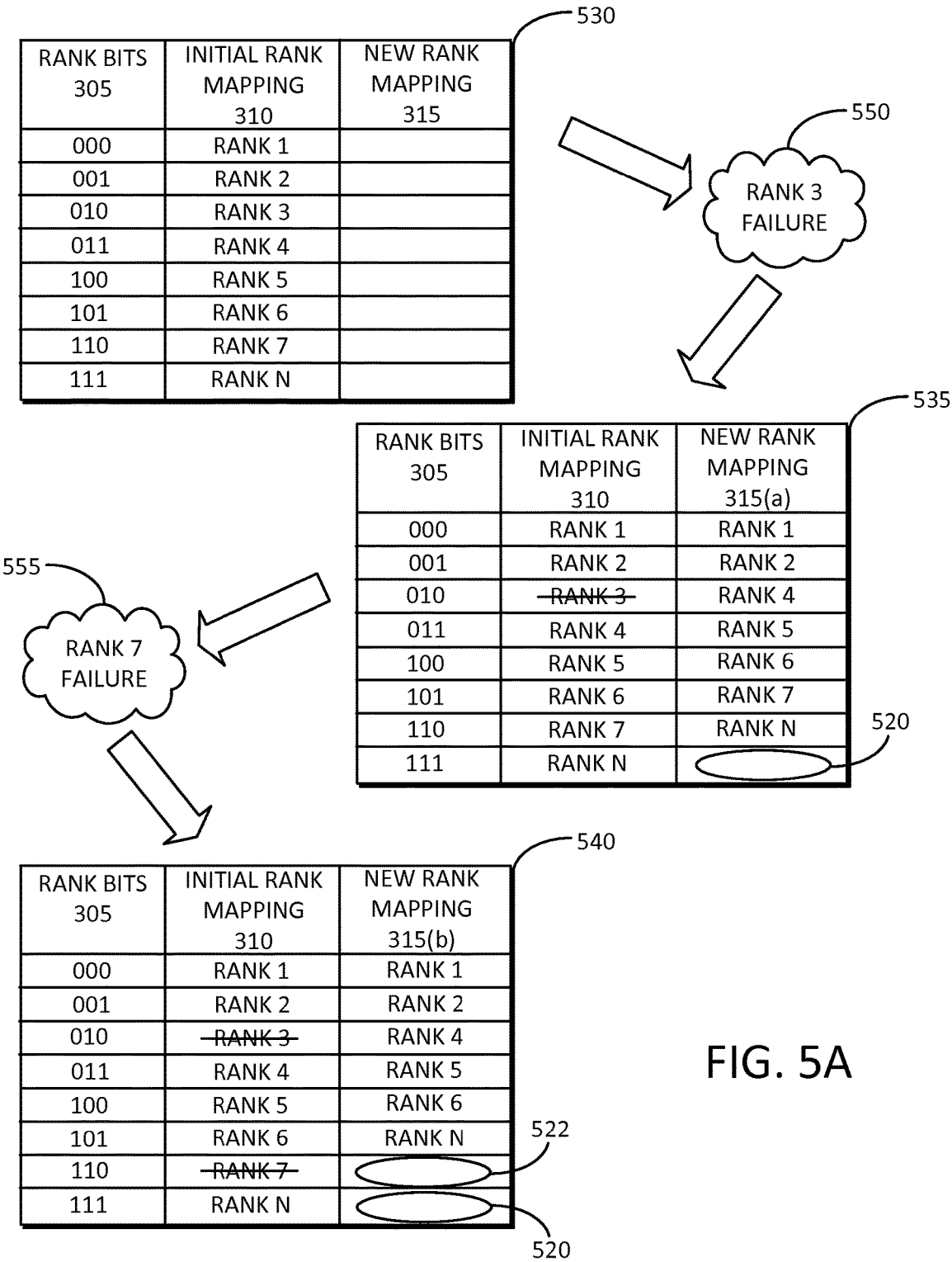
FIG. 5A is yet another example block and flow diagram of a double rank failure and double re-map in accordance with embodiments of the inventive concept.

FIG. 5A is yet another example block and flow diagram, now of a double rank failure and double re-map in accordance with embodiments of the inventive concept. FIG. 5B is yet another example rank remap table in accordance with embodiments of the inventive concept. Reference is now made to FIGS. 5A and 5B. Some of the elements in FIGS. 5A and 5B are similar to or the same as elements of FIGS. 3A and 3B, and therefore, a detailed description of such elements is not repeated.

In this example embodiment, a rank such as rank 3 can experience a failure as shown at 550, followed by another rank, such as rank 7 experiencing a failure as shown at 555. This can cause a transition from block 530 to block 535, then to block 540, and associated changes of state multiple times. The failure of rank 3 can be reflected in the new rank mapping 315(*a*). For example, rank bits 000 can correspond to rank 1, rank bits 001 can correspond to rank 2, rank bits 010 can correspond to rank 4 rather than rank 3, rank bits 011 can correspond to rank 5 rather than rank 4, rank bits 100 can correspond to rank 6 rather than rank 5, rank bits 101 can correspond to rank 7 rather than rank 6, rank bits 110 can correspond to rank N rather than rank 7, and rank bits 111 can correspond to a null entry 520 in the new rank mapping 315(*a*). In effect, ranks 1 and 2 remain in the same position in the new rank mapping 315(*a*) relative to the initial rank mapping 310. Ranks 4 through N can be shifted up. This technique can maintain linearity within the new rank mapping 315(*a*) relative to the initial rank mapping 310. But the rank 3 is not present in the new rank mapping 315(*a*). Rather, a null entry 520 exists at the end of the list of ranks in place of rank 3.

After the failure of rank 3, another rank—rank 7 for example, can experience a failure as shown at 555. This can cause a transition from block 535 to block 540, and associated changes of state. The failure of rank 7 can be reflected in the new rank mapping 315(*b*). For example, rank bits 000 can correspond to rank 1, rank bits 001 can correspond to rank 2, rank bits 010 can correspond to rank 4 rather than rank 3, rank bits 011 can correspond to rank 5 rather than rank 4, rank bits 100 can correspond to rank 6 rather than rank 5, rank bits 101 can correspond to rank N rather than rank 6, rank bits 110 can correspond to a null entry 522, and rank bits 111 can correspond to the null entry 520 in the new rank mapping 315(*b*). In effect, ranks 1 and 2 remain in the same position in the new rank mapping 315(*b*) relative to the initial rank mapping 310. Ranks 4, 5, and 6 are shifted up by one entry. Rank N is shifted up by two entries. In this manner, linearity within the new rank mapping 315(b) can be maintained relative to the initial rank mapping 310. But the ranks 3 and 7 are not present in the new rank mapping 315(b). Rather, the null entry 520 exists at the end of the list of ranks in place of rank 3. Similarly, the null entry 522 exists toward the end of the list of ranks in place of rank 7.

As shown in FIG. 5B, the rank remap table 130 can include an initial rank bits mapping 360 and a new rank bits mapping 365. The initial rank bits mapping 360 can include entries (e.g., 000, 001, 010, 011, 100, 101, 110, and 111) representing an initial mapping of the memory ranks 110 (of FIG. 1). It will be understood that any suitable number of entries can be included in the rank remap table 130 according to the number of ranks. The new rank bits mapping 365 can include entries (e.g., 000, 001, 011, 100, 101, and 111) representing a new mapping of the memory ranks 110. The translation logic section 125 (of FIG. 1) can map between the initial rank bits mapping 360 and the new rank bits mapping 365 based at least on the rank remap table 130.

Put differently, the new rank bits mapping 365 can include a null entry 525 representing the failed memory rank 3, the null entry 527 representing the failed memory rank 7, and non-null entries (e.g., 000, 001, 011, 100, 101, and 111) representing non-failed memory ranks. The null entry 525 can be at an end of the entries of the new rank bits mapping 365. The null entry 527 can be toward the end of the entries of the new rank bits mapping 365. Each non-null entry (e.g., 000, 001, 011, 100, 101, and 111) of the new rank bits mapping 365 can be adjacent to at least one other non-null entry (e.g., 000, 001, 011, 100, 101, and 111). The last remaining non-null entry (e.g., 111) can be adjacent to only one other non-null entry (e.g., 101). The null entry 527 can be adjacent to only one non-null entry (e.g., 111). The null entry 525 can be adjacent to only one null entry 527. In some embodiments, where there are more than two errors, at least one null entry can have two adjacent null entries and no adjacent non-null entries.

Each of the entries of the new rank bits mapping 365 can include a set of bits (e.g., 000, 001, 011, 100, 101, and 111) or a null entry (e.g., 525 or 527). The higher order bits (e.g., 110 and 111, etc.) of the initial rank bits mapping 360 can be associated with the null entries 527 and 525, respectively. The lower order bits (e.g., 000, 001, and 010, etc.) of the initial rank bits mapping 360 can be associated with the set of bits (e.g., 000, 001, and 011, etc.), respectively, of the new rank bits mapping 365, and so forth.

Figure 6:
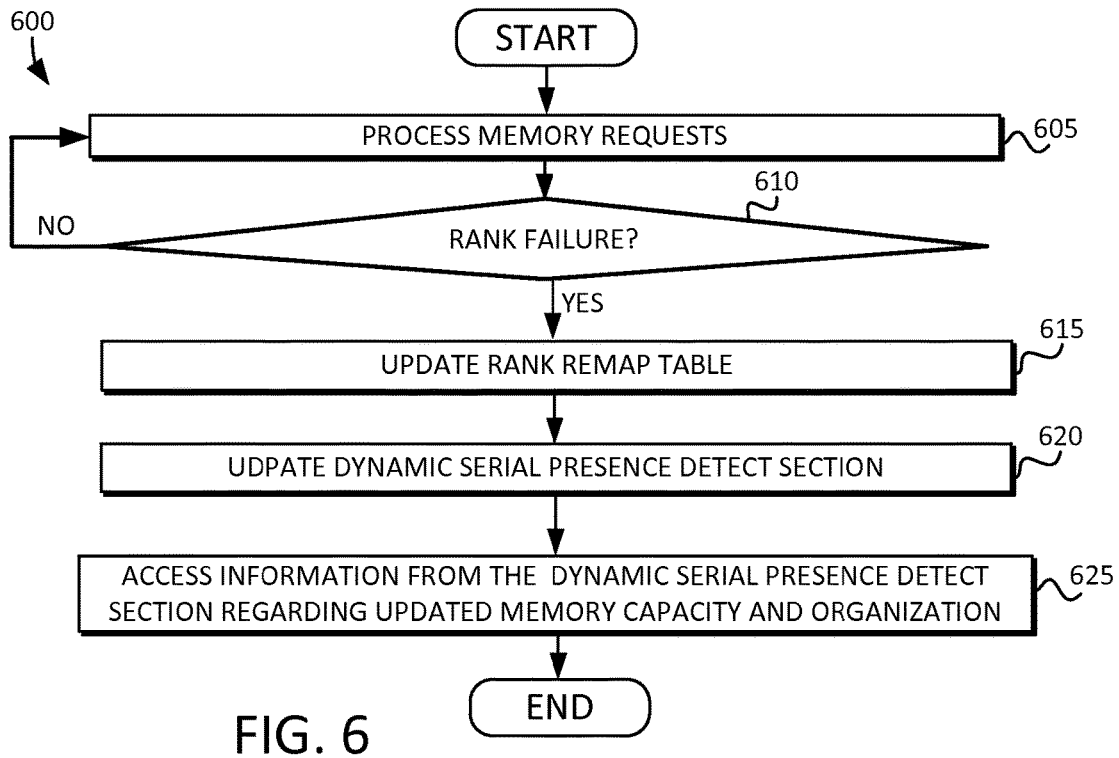
FIG. 6 illustrates a flow diagram including a technique for handling a rank failure in accordance with embodiments of the inventive concept.

FIG. 6 illustrates a flow diagram 600 including a technique for handling a rank failure in accordance with embodiments of the inventive concept. The technique can begin at 605 where memory requests are processed. A determination can be made at 610 whether a rank failure has occurred. If NO, meaning no rank failure has occurred, the flow can return to 605 for further processing of memory requests. Otherwise, if YES, meaning a rank failure has occurred, the flow can proceed to 615 where the rank remap table 130 (of FIG. 1) can be updated to reflect the rank failure. At 620, the dynamic serial presence detect section 120 (of FIG. 1) can be updated. For example, the dynamic serial presence detect section 120 can update the stated total capacity of the memory module and/or other baseline information as discussed above. At 625, other logic components of the memory module can access information from the dynamic serial presence detect section 120 regarding, for example, the updated memory capacity and/or changed organization of the memory module.

One or more pieces of information can be written to the dynamic serial presence detection section 120 to advertise to other components of the memory module the correct capacity and/or organization. A basic input/output system (BIOS) of a computer server or system can access such information from the dynamic serial presence detection section 120. It will be understood that the steps need not occur in the illustrated order, but rather, can occur in a different order and/or with intervening steps.

Figure 7:
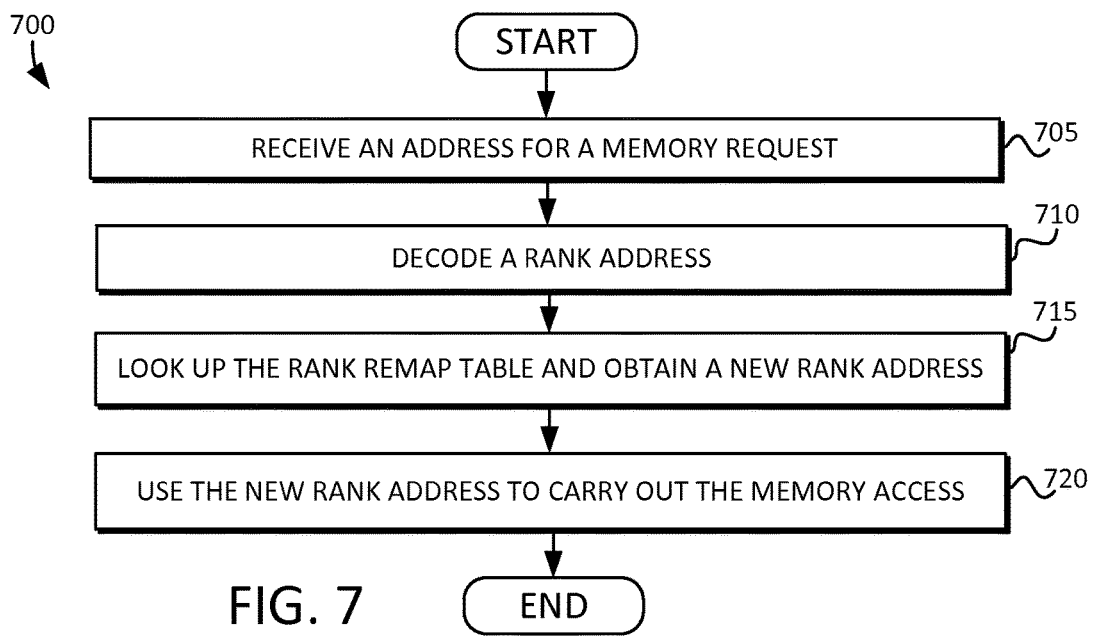
FIG. 7 illustrates a flow diagram including a technique for using a rank remap table for carrying out a memory access in accordance with embodiments of the inventive concept.

FIG. 7 illustrates a flow diagram 700 including a technique for using a rank remap table for carrying out a memory access in accordance with embodiments of the inventive concept. The technique can begin at 705 where an address is received for a memory request. At 710, a rank address can be decoded from the address. For example, the translation logic section 125 (of FIG. 1) can decode the rank address.

At 715, the translation logic section 125 can look up the rank remap table 130 (of FIG. 1) and obtain a new rank address. At 720, the memory module 105 (of FIG. 1) can use the new rank address to carry out the memory access. The memory access can be a read access, a write access, or the like. It will be understood that the steps need not occur in the illustrated order, but rather, can occur in a different order and/or with intervening steps.

Figure 8A:
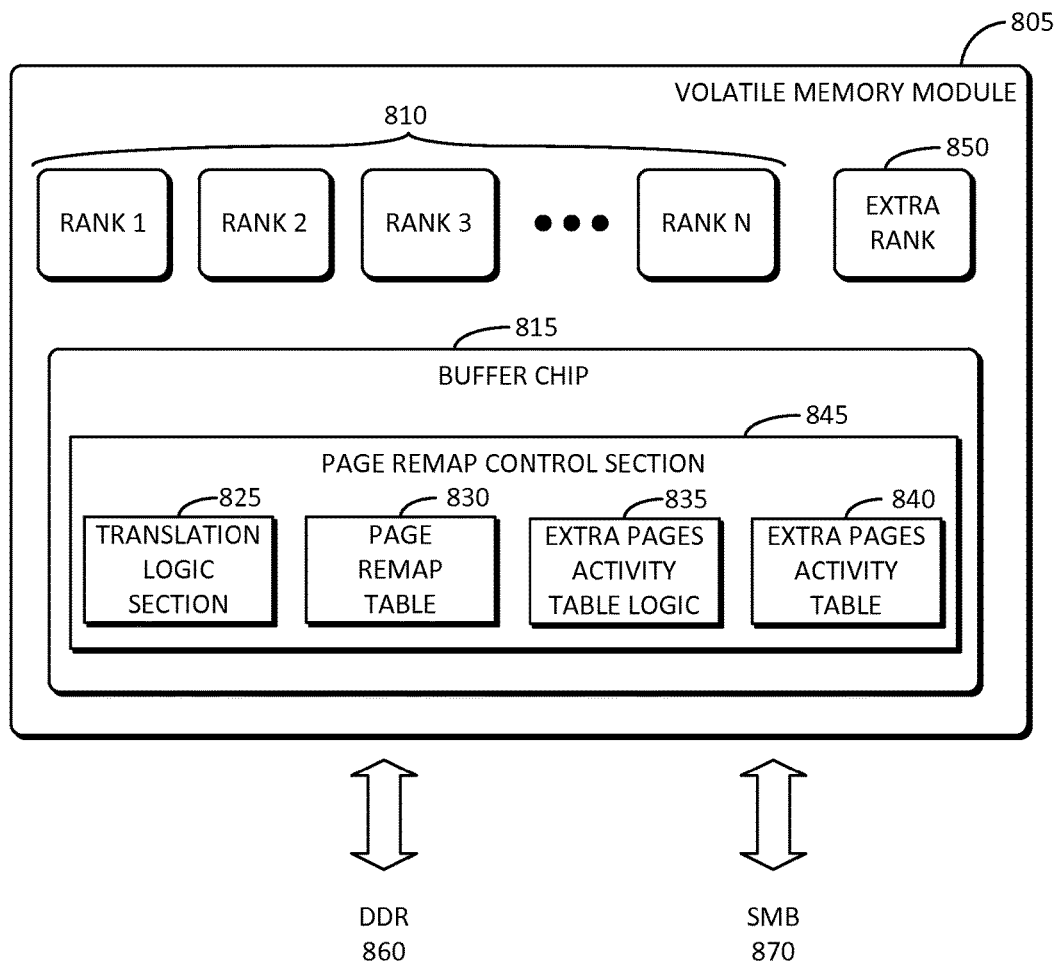
FIG. 8A is another example block diagram of a volatile memory module in accordance with embodiments of the inventive concept.

FIG. 8A is another example block diagram of a volatile memory module 805 in accordance with embodiments of the inventive concept. The volatile memory module 805 can include multiple memory ranks 810. In addition, the volatile memory module 805 can include an extra rank 850 in addition the memory ranks 810. The extra rank 850 can function as a spare rank configured to store new pages corresponding to failed pages from the memory ranks 810. The volatile memory module 805 can include a buffer chip 815 such as a load reduced DIMM. The buffer chip 815 can include a page remap control section 845. The page remap control section 845 can remap a failed page from among the memory ranks 810 to a new page in the extra rank 850.

The page remap control section 845 can include a page remap table 830, which can include a mapping between the failed page and the new page. The page remap control section 845 can include a translation logic section 825 configured to map between the failed page and the new page based at least on the page remap table 830. The translation logic section 825 can be the same logical block as or a different logical block from the translation logic section 125 (of FIG. 1). The translation logic section 825 can decode a page address from a memory request, look up the page remap table 830 to obtain a new page address associated with the new page, and cause the new page address to be used to carry out the memory request.

The page remap control section 845 can include an extra pages activity table 840 including multiple pages associated with the extra rank 850. The page remap control section 845 can include an extra pages activity table logic section 835. The extra pages activity table logic section 835 can track which of the pages from among the multiple pages associated with the extra rank 850 are in use or not in use. In other words, the extra pages activity table logic section 835 can look up the extra pages activity table 840 to determine whether a page from among the multiple pages associated with the extra rank 850 is not in use and available.

In response to determining that the page is not in use and available, the extra pages activity table logic section 835 can update the page remap table 830 to reflect the new mapping to the new page in the extra rank 850. The volatile memory module 805 can communicate with other components of a computer server or system via a double data rate (DDR) 860 protocol, a serialized memory bus (SMB) 870 protocol, or the like.

Figure 8B:
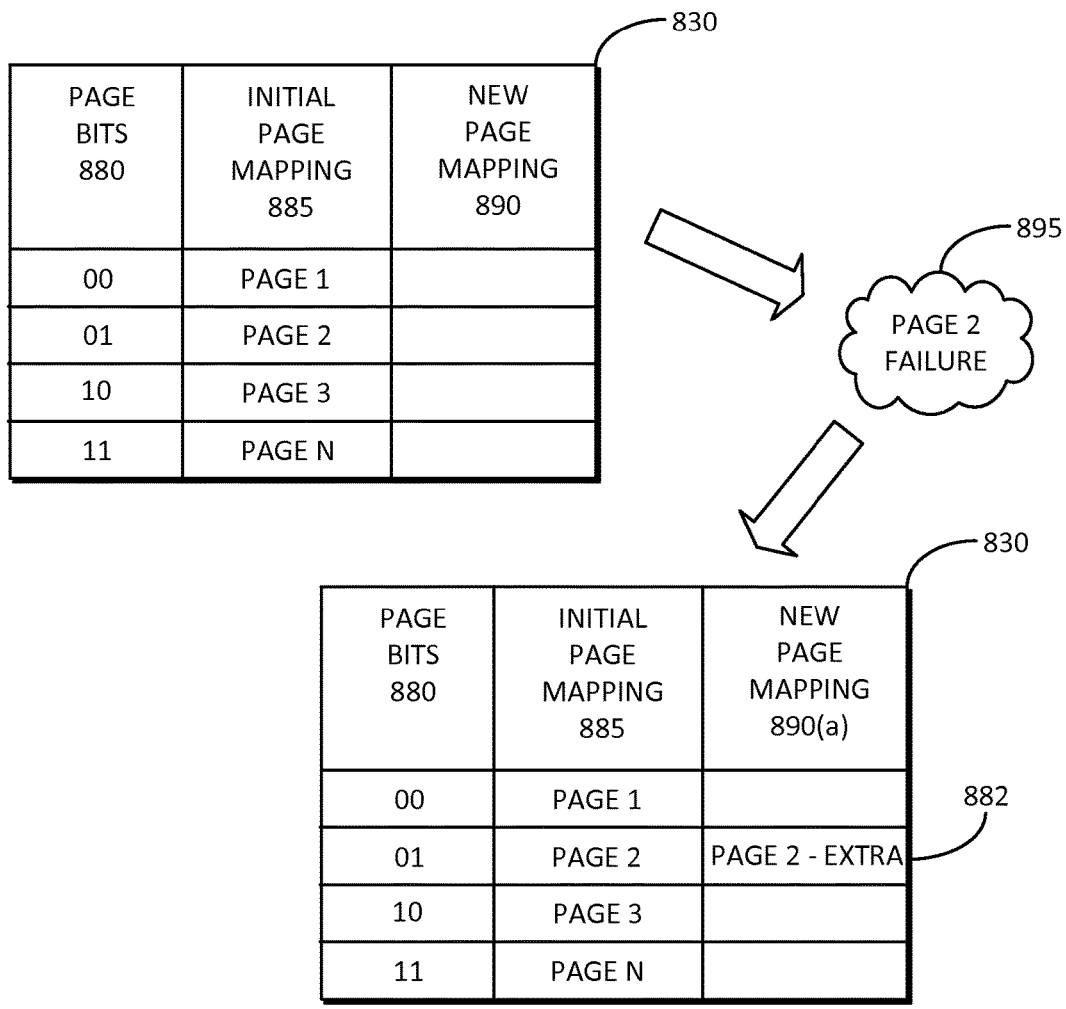
FIG. 8B is an example block and flow diagram of a memory page failure and re-map in accordance with embodiments of the inventive concept.

FIG. 8B is an example block and flow diagram of a memory page failure and re-map in accordance with embodiments of the inventive concept. The page remap table 830 can include, for example, page bits 880, an initial page mapping 885, and a new page mapping 890. The page bits can correspond to the various memory pages. For example, page bits 00 can correspond to page 1, page bits 01 can correspond to page 2, page bits 10 can correspond to page 3, page bits 11 can correspond to page N, and so forth. In the event that a memory page experiences a failure, such as a failure of page 2 shown at 895, then page remap table 830 can be updated to reflect the new page mapping 890(*a*). More specifically, a new entry and/or memory page address 882 can be included in the page remap table 830, which indicates that the new page mapping for page 2 is for a memory page address within the extra rank 850. In the event of subsequent access request to page 2, the translation logic section 825 (of FIG. 8A) can decode a page address from a memory request, look up the page remap table 830 to obtain a new page address 882 associated with the new (i.e., spare) page, and cause the new page address 882 to be used to carry out the memory request.

Figure 9:
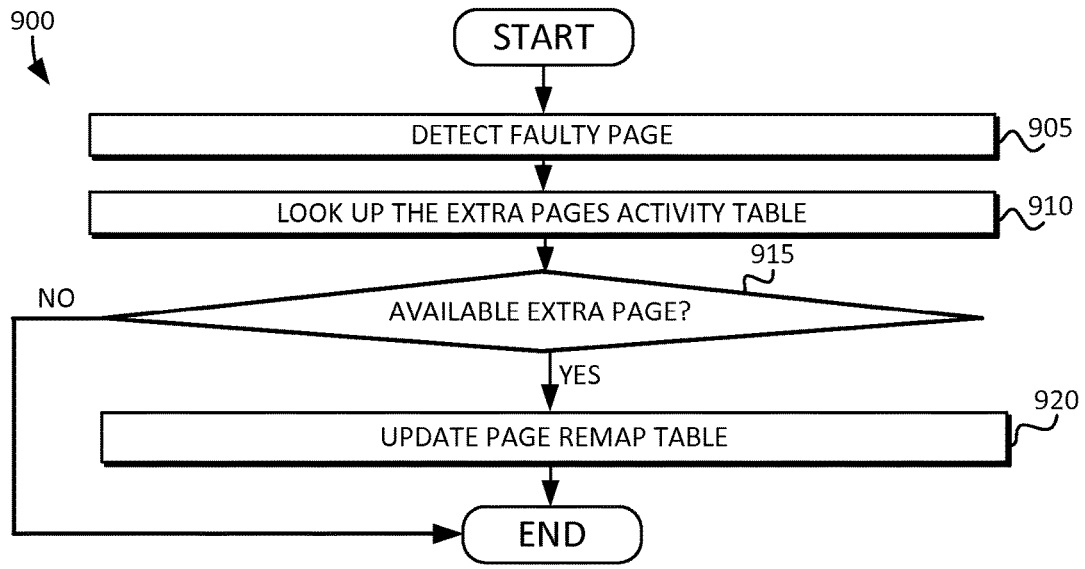
FIG. 9 illustrates a flow diagram including a technique for handling a page failure in accordance with embodiments of the inventive concept.

FIG. 9 illustrates a flow diagram 900 including a technique for handling a page failure in accordance with embodiments of the inventive concept. The technique can begin at 905, where a faulty page can be detected. At 910, the extra pages activity table logic section 835 (of FIG. 8) can look up the extra pages activity table 840. At 915, a determination can be made whether an extra page is available in the extra pages activity table 840. If the determination is YES, meaning that an extra page is available, the flow can proceed to 920, where the page remap table 830 can be updated to reflect the new mapping to the new page in the extra rank 850. In other words, a pair address including the address and the available new page can be written to the page remap table 830. The page remap table 830 can include a directory-like structure that can keep track of the correspondence between the original page address and the new page address. Otherwise, if NO, the technique can continue to detect faulty pages and remap when necessary. It will be understood that the steps need not occur in the illustrated order, but rather, can occur in a different order and/or with intervening steps.

Figure 10:
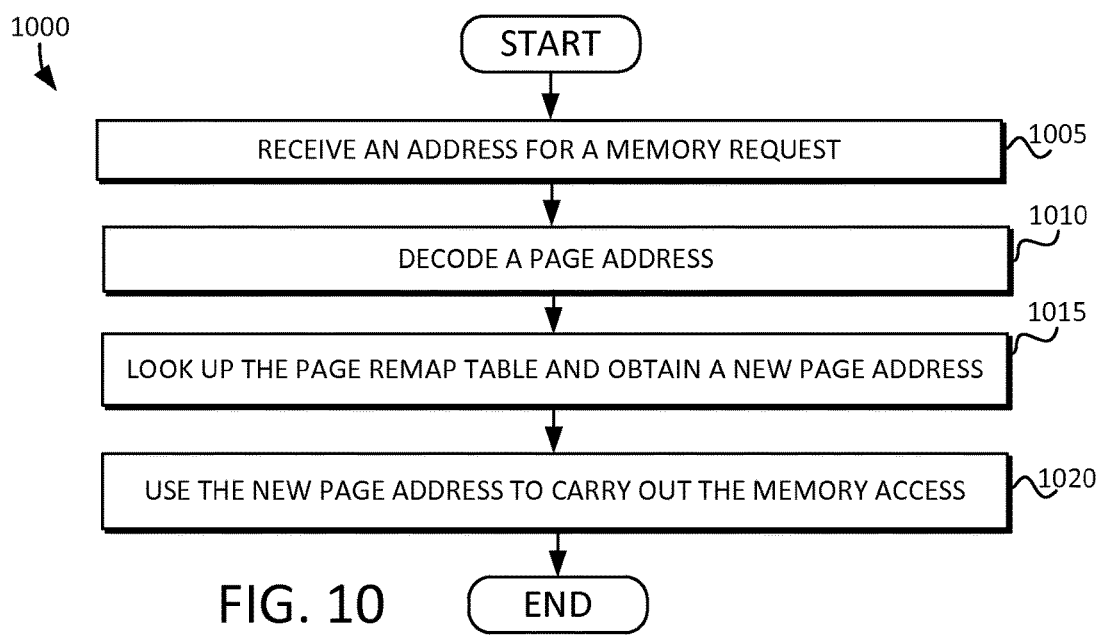
FIG. 10 illustrates a flow diagram including a technique for using a page remap table for carrying out a memory access in accordance with embodiments of the inventive concept.

FIG. 10 illustrates a flow diagram 1000 including a technique for using a page remap table 830 (of FIG. 8) for carrying out a memory access in accordance with embodiments of the inventive concept. The technique can begin at 1005, where an address for a memory request is received. At 1010, a page address can be decoded from the memory address. At 1015, the translation logic section 825 (of FIG. 8) can look up the page remap table 830 and obtain a new page address. At 1020, the new page address can be used to carry out the memory access. The memory access can include a memory read, a memory write, or the like. It will be understood that the steps need not occur in the illustrated order, but rather, can occur in a different order and/or with intervening steps.

Figure 11:
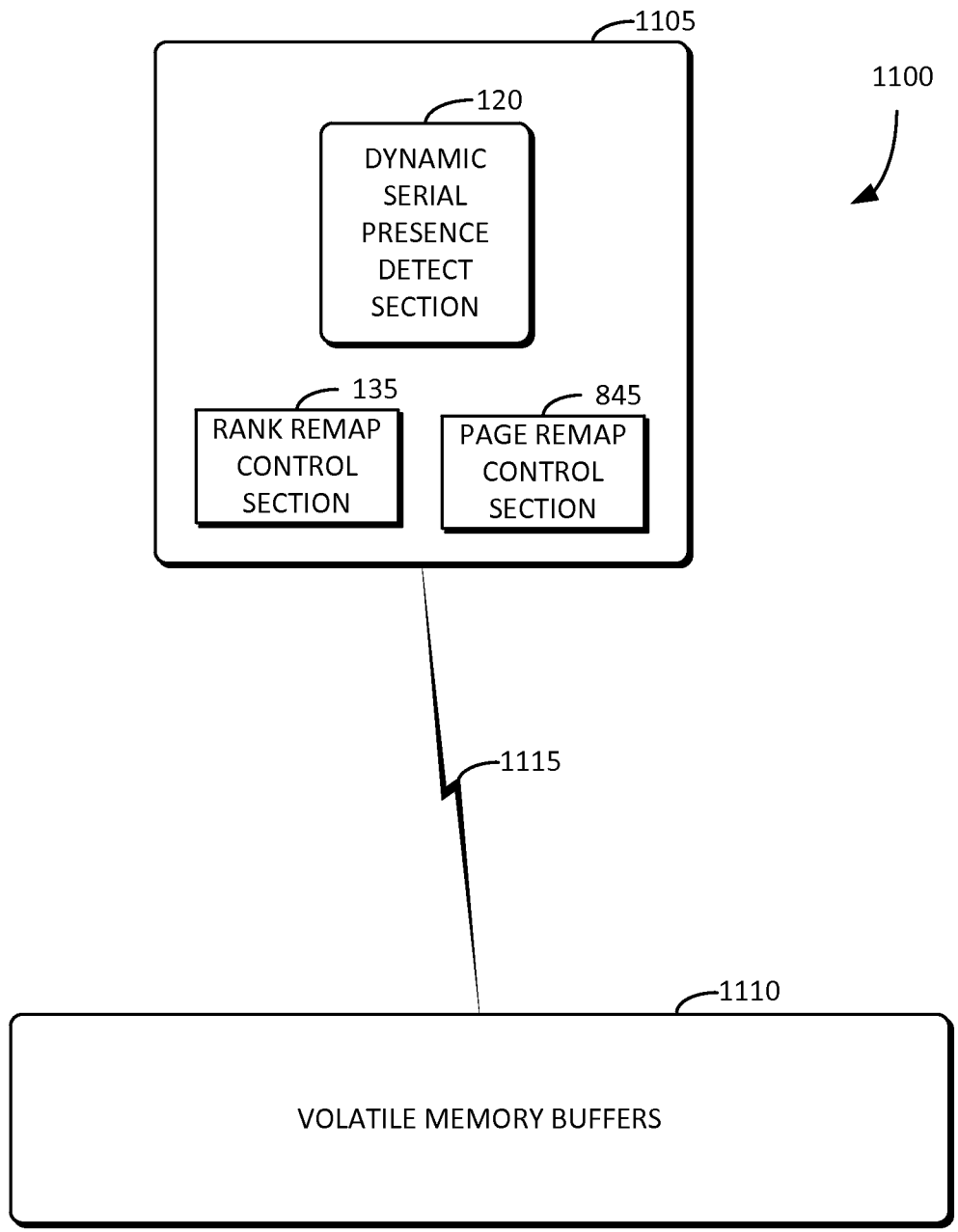
FIG. 11 is a block diagram of a computing system including a memory controller and volatile memory buffers in accordance with embodiments of the inventive concept.

FIG. 11 is a block diagram of a computing system 1100 including a memory controller 1105, volatile memory buffers 1110, and communication means 1115 in accordance with embodiments of the inventive concept. The memory controller 1105 can include the dynamic serial presence detect section 120, the rank remap control section 135, and/or the page remap control section 845, having properties described in their respective sections, for example, in detail above. The memory controller 1105 can be in communication with the volatile memory buffers 1110 via the communication means 1115.

The communication means 1115 can include a processor-to-processor link such as QuickPath Interconnect (QPI). The communication means 1115 can include an I/O link such as peripheral component interconnect express (PCIe). The communication means 1115 can include a storage link such as serial attached small computer system interface (SAS). The communication means 1115 can include a link protocol. The link protocol can include a serialized memory protocol such as serialized double data rate 4 (DDR4). The link protocol can be packetized. The link protocol can include a wormhole routing protocol. The volatile memory buffers 1110 can have varying levels of memory controller functionality, including none at all. The memory controller 1105 can have separate protocol generators, link-layers, and/or controllers for a multi-modal link, or a single controller that may be multi-modal. The memory controller 1105 can be a multi-port controller, which can handle one or more native memory interfaces (e.g., DDR4). Alternatively or in addition, the memory controller 1105 can be a dedicated controller for native memory as well as the volatile memory buffers 1110 that can be accessed over the communication means 1115 such as a multi-modal link.

Figure 12:
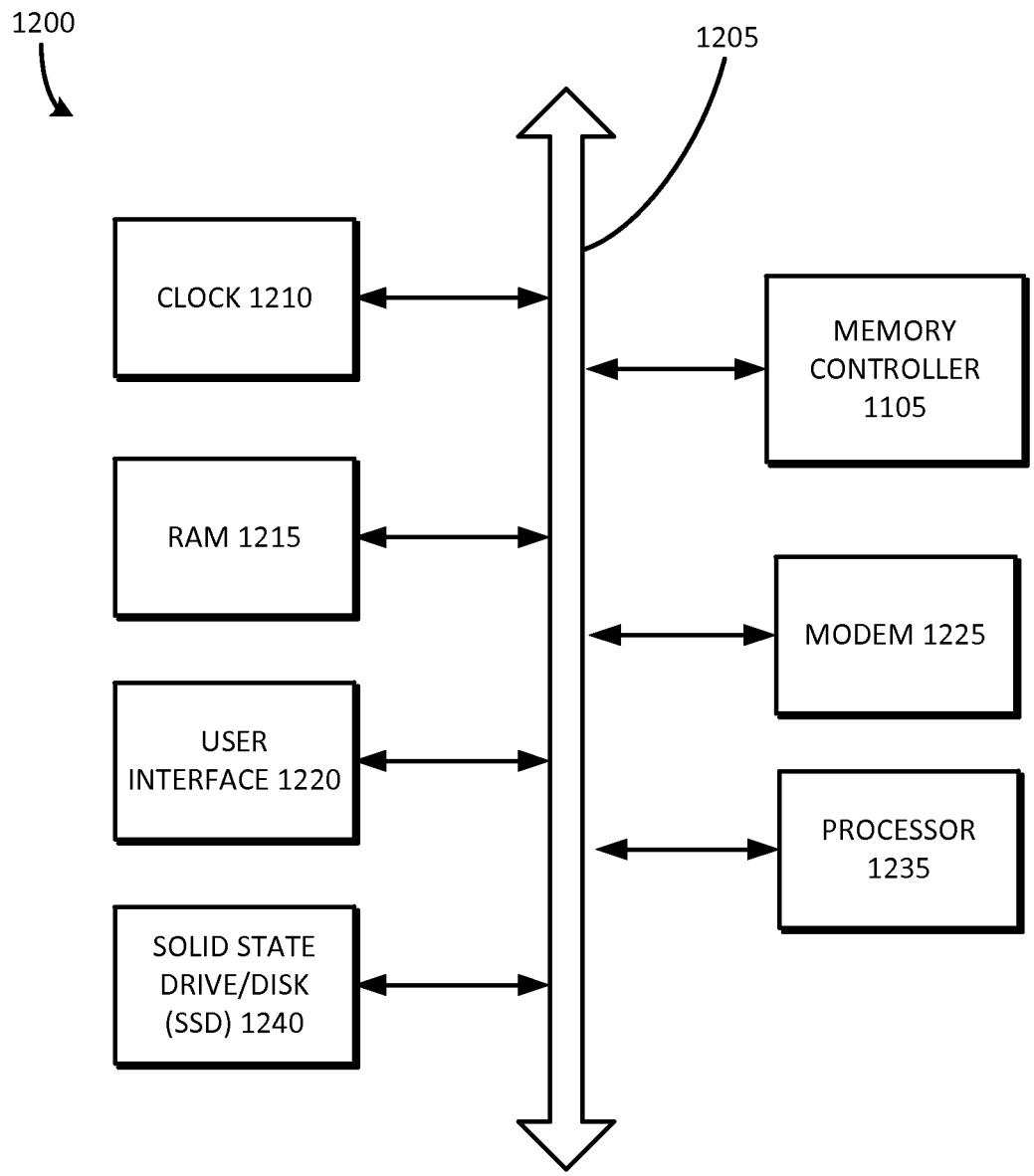
FIG. 12 is a block diagram of a computing system including the memory controller of FIG. 11.

FIG. 12 is a block diagram of a computing system 1200 including the memory controller 1105 of FIG. 11. Referring to FIG. 12, the computing system 1200 may also include a clock 1210, a random access memory (RAM) 1215, a user interface 1220, a modem 1225 such as a baseband chipset, a solid state drive/disk (SSD) 1240, and/or a processor 1235, any or all of which may be electrically coupled to a system bus 1205. The memory controller 1105 can correspond to that described in detail above, and as set forth herein, and may also be electrically coupled to the system bus 1205. The memory controller 1105 can include or otherwise interface with the clock 1210, the random access memory (RAM) 1215, the user interface 1220, the modem 1225, the solid state drive/disk (SSD) 1240, and/or the processor 1235.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A volatile memory module, comprising:
a plurality of memory ranks;
a rank remap control section configured to remap a rank from among the plurality of memory ranks of the volatile memory module responsive to a failure of the rank; and
a dynamic serial presence detect section configured to dynamically update a stated total capacity of the volatile memory module based at least on the remapped rank.

2. The volatile memory module of claim 1, wherein the dynamic serial presence detect section is configured to dynamically reduce the stated total capacity of the volatile memory module by approximately a capacity of the failed rank responsive to the failure of the rank.

3. The volatile memory module of claim 1, wherein the dynamic serial presence detect section is further configured to dynamically change one or more settings of the volatile memory module responsive to the failure of the rank.

4. The volatile memory module of claim 1, wherein the rank remap control section further comprises:
a rank remap table including an initial rank mapping and a new rank mapping, the initial rank mapping including a first plurality of entries representing an initial mapping of the plurality of memory ranks, the new rank mapping including a second plurality of entries representing a new mapping of the plurality of memory ranks; and
a translation logic section configured to map between the initial rank mapping and the new rank mapping based at least on the rank remap table.

5. The volatile memory module of claim 4, wherein:
in response to the failure of the rank, the translation logic section is configured to determine that an entry from among the first plurality of entries of the initial rank mapping is invalid, and to cause the second plurality of entries of the new rank mapping to exclude an equivalent entry corresponding to the entry.

6. The volatile memory module of claim 5, wherein the second plurality of entries include a null entry in the new rank mapping representing the failed rank, and non-null entries representing non-failed ranks.

7. The volatile memory module of claim 6, wherein the null entry is at an end of the second plurality of entries of the new rank mapping.

8. The volatile memory module of claim 7, wherein the null entry is adjacent to only one non-null entry from among the second plurality of entries.

9. The volatile memory module of claim 4, wherein each of the first plurality of entries includes a first plurality of bits.

10. The volatile memory module of claim 9, wherein:
each of the second plurality of entries includes a second plurality of bits or a null entry;
higher order bits of the first plurality of bits are associated with the null entry; and
lower order bits of the first plurality of bits are associated with the second plurality of bits.

11. A volatile memory module, comprising:
a plurality of memory ranks;
an extra rank in addition to the plurality of memory ranks, the extra rank being a spare rank configured to store a new page corresponding to a failed page from among the plurality of ranks; and
a page remap control section configured to remap the failed page from among the plurality of ranks to the new page in the extra rank;
wherein the page remap control section further includes:
a page remap table including a mapping between the failed page and the new page; and
a translation logic section configured to map between the failed page and the new page based at least on the page remap table;

a rank remap control section configured to remap a rank from among the plurality of memory ranks of the volatile memory module responsive to a failure of the rank; and a dynamic serial presence detect section configured to dynamically update a stated total capacity of the volatile memory module based at least on the remapped rank, wherein the translation logic section is configured to decode a page address from a memory request, look up the page remap table to obtain a new page address associated with the new page, and to cause the new page address to be used to carry out the memory request.

12. The volatile memory module of claim 11, wherein the page remap control section further includes:

an extra pages activity table including one or more pages associated with the extra rank; and an extra pages activity table logic section configured to track which of the pages from among the one or more pages associated with the extra rank are in use or not in use.

13. The volatile memory module of claim 12, wherein the extra pages activity table logic section is further configured to:

look up the extra pages activity table to determine whether a page from among the one or more pages associated with the extra rank is not in use and available; and in response to determining that the page is not in use and available, updating the page remap table.

14. A computer-implemented method for remapping memory ranks in a volatile memory, the method comprising:

remapping, by a rank remap control section, a rank from among a plurality of memory ranks responsive to a failure of the rank; and dynamically updating, by a dynamic serial presence detect section, a stated total capacity of a plurality of volatile memory buffers based at least on the remapped rank.

15. The method of claim 14, further comprising:

storing, in a rank remap table, an initial rank mapping and a new rank mapping, the initial rank mapping including a first plurality of entries representing an initial mapping of the plurality of memory ranks, the new rank mapping including a second plurality of entries representing a new mapping of the plurality of memory ranks; and mapping, by a translation logic section, between the initial rank mapping and the new rank mapping based at least on the rank remap table.

16. The method of claim 15, further comprising:

updating the rank remap table responsive the failure of the rank.

17. The method of claim 14, further comprising:

providing an extra rank in addition to the plurality of memory ranks;

storing, in the extra rank, a new page corresponding to a failed page from among the plurality of ranks; and remapping, by the rank remap control section, the failed page from among the plurality of ranks to the new page in the extra rank.

18. The method of claim 17, further comprising:

providing a page remap table including a mapping between the failed page and the new page; and mapping, by a translation logic section, between the failed page and the new page based at least on the page remap table.

* * * * *